United States Patent [19]

Gillette

[11] 4,301,333

[45] Nov. 17, 1981

[54] SPEECH COMPRESSION

[75] Inventor: Richard J. Gillette, Winfield, Mo.

[73] Assignee: McDonnell Douglas Corporation, St. Louis, Mo.

[21] Appl. No.: 34,767

[22] Filed: Apr. 30, 1979

Related U.S. Application Data

[63] Continuation of Ser. No. 838,387, Sep. 30, 1977, abandoned.

[51] Int. Cl.[3] .............. H03K 13/32

[52] U.S. Cl. .............. 179/15.55 R

[58] Field of Search .............. 179/15.55 T, 15.55 R; 325/38 B; 340/347 DD; 360/8; 375/30, 31

[56] References Cited

U.S. PATENT DOCUMENTS

| | | | |
|---|---|---|---|
| 3,688,221 | 8/1972 | Fruhalf | 325/38 B |
| 3,696,402 | 10/1972 | Armstrong | 179/15.55 R |
| 3,875,344 | 4/1975 | Bogart | 179/15.55 T |
| 3,945,002 | 3/1976 | Duttweiler et al. | 179/15 AV |
| 3,949,298 | 4/1976 | Boxal | 325/38 B |

OTHER PUBLICATIONS

M. Croll "Nearly Instantaneous Digital etc.", Elec. Letters, Jul. 12, 1973, pp. 298-300.

*Primary Examiner*—Mark E. Nusbaum

*Assistant Examiner*—E. S. Kemeny

*Attorney, Agent, or Firm*—Polster, Polster and Lucchesi

[57] ABSTRACT

A device for providing real time speech compression and expansion and method therefor which enables speech data, sampled at a predetermined rate, and consisting of a preselected number of bits per sample, to be compressed in real time by a factor of approximately 2:1, and upon decompression, to be essentially indistinguishable from the original digitized speech. In particular, the apparatus employs a method which involves the digitizing of the input data, determining the maximum amplitude of the data over a short given period, compressing the data by dividing the largest amplitude constant from the data over the given period to obtain a data sample, and storing the reduced data sample and corresponding amplitude constant or gain factor in a suitable storage medium. In the preferred embodiment, the storage medium is a rotating memory or a recirculating shift register. Amplitude or gain factor data is stored in a memory that need be only one sixty-fourth the size of the main memory, since, in the embodiment illustrated, a single gain factor data representation is used with sixty-four sets of sample data. On recall, sets of the sample data are multiplied by their corresponding gain factor to reproduce the data for use.

4 Claims, 13 Drawing Figures

SPEECH COMPRESSION

This is a continuation, of application Ser. No. 838,387 filed Sept. 30, 1977, now abandoned.

BACKGROUND OF THE INVENTION

This invention relates to data compression and expansion and in particular, to a method and device for real time speech compression and expansion. While the device is described in conjunction with an announcement system whose function is compatible with telephone lines, those skilled in the art will recognize the wider applicability of the inventive principles disclosed hereinafter.

A number of digital compressors and expanders have been developed in the prior art. In general, these devices operate to reduce the number of bits requiring transmission in a data stream from the processor to an associated expanding device, with or without intermediate storage. Examples of this form of processor are shown and described in the United States Patents to Duttweiler et al, U.S. Pat. No. 3,945,002, dated Mar. 16, 1976, and references cited therein. Other system forms are designed to determine majority binary value in particular groups and that majority value is further utilized in the system. An example of this later design concept is disclosed in the United States Patent to Armstrong, U.S. Pat. No. 3,696,402, dated Oct. 3, 1972, and references cited therein.

While the Duttweiler and Armstrong patents in particular, and the prior art in general, work well for their intended purposes, they do not lend themselves to use in the particular system utilization with which the invention disclosed hereinafter is directed. The system with which my invention initially found utility is such that real time speech compression and expansion is mandatory. In addition, the resulting decompression should have a quality nearly equal to a recording. The technique developed in view of this need enables speech data, sampled at an eight K hertz rate, consisting of eight bits per sample, to be compressed in real time by a factor of approximately 2:1, and upon decompression, be essentially indistinguishable from the original digitized speech data. Decompression is accomplished simply and with minimum hardware.

In general, the technique used in compressing the speech data involves digitizing the data, determining the maximum amplitude of the digitized data over a given short period, compressing the data by dividing the largest amplitude constant over this short period into the digitized data of the corresponding short period, and storing the results on some suitable storage medium. To decompress the data, the data is accessed from the storage medium and the constant inserted. Thereafter, the data may be converted from digital to analog form for furtheruse. The particular system with which the compression and decompression scheme finds application also employs a novel memory means for sample data storage.

One of the objects of this invention is to provide an improved technique for compressing audio data.

Another object of this invention is to provide a compression scheme for audio data which reduces the storage requirement of the data.

Another object of this invention is to provide a low cost storage device for audio data.

Other objects will be apparent to those skilled in the art in light of the following description and accompanying drawings.

SUMMARY OF THE INVENTION

In accordance with this invention, generally stated, a novel compression scheme is employed for compression of audio data to attain an approximate 2:1 reduction of sample data. Data reduction is accomplished by determining a gain factor for a preselected length of data sets. In the embodiment illustrated, the preselected data length comprises sixty-four sets of data, each set comprising eight bits. The maximum amplitude for each of the sixty-four data sets is determined and this maximum amplitude is encoded to provide a gain factor. Thereafter, the gain factor is divided into, i.e. removed, from the corresponding sixty-four sets of data to obtain a compressed four bit set of sample data for each one of the sixty-four data sets. The compressed sample data set is stored for use as necessary in a suitable storage medium. Recomposition is accomplished by multiplying the gain factor of the sixty-four sample set by each sample in that set.

The preferred design for the memory employed with the compression scheme of this invention is a series of charge coupled device memories, which can be thought of as a rotating memory or a recirculating shift register. Magnitude data is stored in a smaller memory and information is withdrawn from the memories as required. The particular embodiment enables up to two hundred and fifty-six messages to be played simultaneously. Any combination, from all messages being the same to all messages being different within the range of two hundred and fifty-six accesses is possible.

DESCRIPTION OF THE PREFERRED EMBODIMENT

Figure 1:
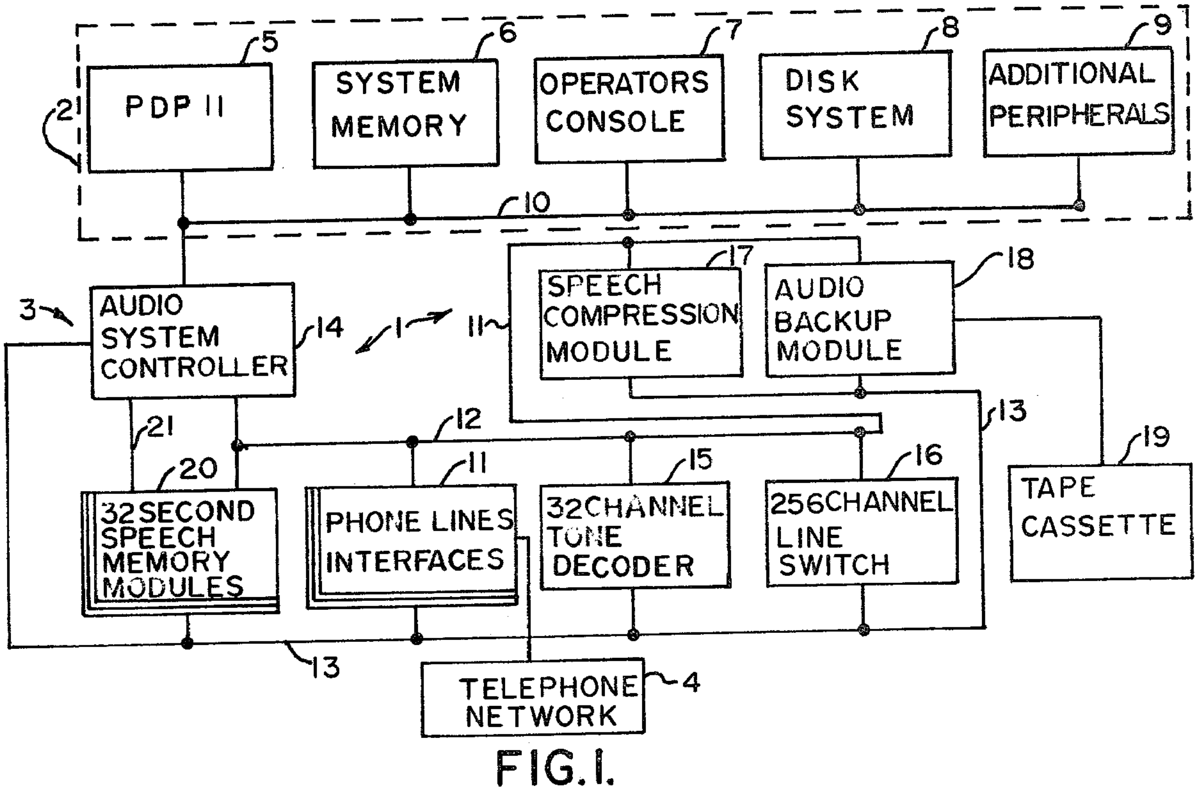
FIG. 1 is a block diagram view of a multi-media announcement system employing a speech compression module utilizing compression scheme of this invention.

Referring now to FIG. 1, reference numberal 1 indicates a multi-media system with which the invention disclosed hereinafter finds application. The system 1 includes a computer 2, generally enclosed by phantom lines, and an announcement system 3 interposed between the computer 2 and a telephone network 4.

The computer 2 is conventional and includes a processor 5, a computer system memory 6, a suitable operator input console 7, a disc storage memory 8, and any additional peripherals 9 that may be desired for use with the computer 2. The components of the computer 2 are interconnected along a bus 10. The computer 2 may comprise any of a variety of commercially available devices and is not described in detail.

The telephone network 4 is operatively connected to the announcement system 3 through a suitable interface means 11. In the embodiment illustrated, up to two hundred fifty-six individual telephone lines of the network 4 may be interconnected to the announcement system 3. The interface means 11 is connected to a control bus 12 and to an audio bus 13 in a conventional manner. As will be appreciated by those skilled in the art, the single electrical conductor shown for the bus 12 and bus 13 is merely illustrative of the multiple electrical connections represented by the bus designations.

The control bus 12 is connected to an audio system controller 14. The controller 14 may be considered a special purpose computer which controls the operation of the announcement system 3. Also connected between the buses 12 and 13 are a tone decoder 15, a switching means 16, a speech compression module 17, an audio back-up module 18, a conventional tape cassette 19 and memory means 20. The memory means 20 also is connected to the controller 14 along a speech segment bus 21.

The tone decoder 15, line switching means 16, audio back-up module 18 and tape cassette 19 are shown for information purposes only, and while important in the overall operation of the announcement system 3, they for no part of the invention disclosed hereinafter.

The system 3 may take data directly from the network 4, or that data may be inputed to the audio back-up module 18 and the tape cassette 19. The audio back-up module 18 and tape cassette 19 are safety features employed in the system 3 and are not described in detail. In general, data for replay may be inputed to the memory 20 merely by utilizing the telephone network 4 and calling in the desired data. The audio back-up module 18 and tape cassette 19 define a back-up system for ensuring retention of the input data which is important in commercial embodiments of the invention, that back-up not being required for normal system 3 operation.

The audio input data is converted in the phone line interface 11 to digital information and passed via the audio bus 13 to the speech compression module 17. The phone line interface 11 includes an arrangement of analog to digital (AD) converters, not shown, for data conversion.

Figure 2:
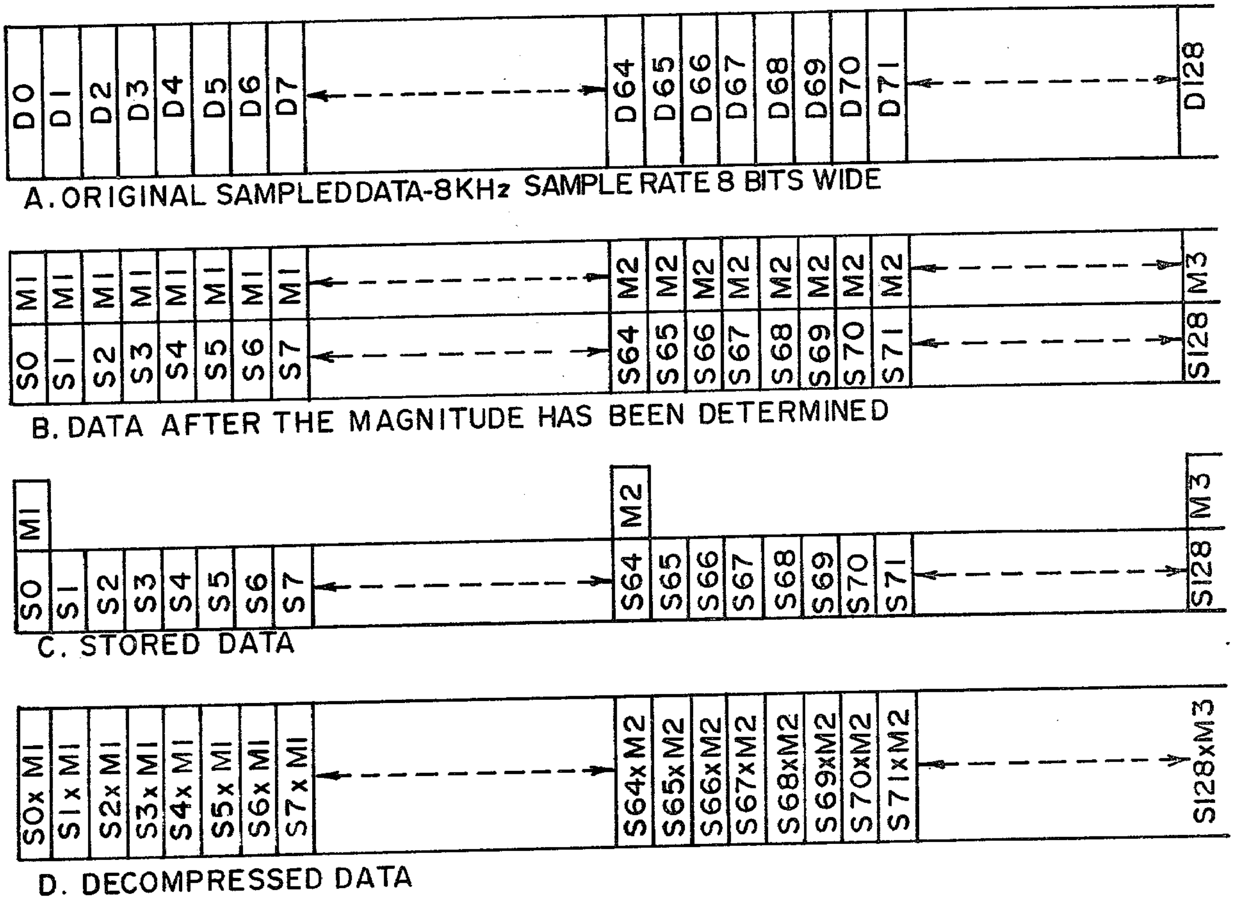
FIG. 2A through FIG. 2D is a diagrammatic representation of a speech compression algorithm employed in the speech compression module used in the announcement system of FIG. 1.

The speech compression module 17 employs a unique method for obtaining real time speech compression of the input audio data. Upon decompression that data has a quality nearly equal to a recording. The data input from the telephone network is sampled at an eight K hertz rate, and consists of eight bits per sample. FIG. 2 illustrates the compression technique. As indicated, the data is digitized in the phone line interface 11. This digitized data is an input to the speech compression module 17. There, the maximum amplitude of the data over a predetermined time period is determined. The largest amplitude constant is removed from the data and the data is stored in the memory means 20. FIG. 2*a* shows original sampled data. A given set of contiguous samples, sixty-four samples in the case illustrated, are examined for peak amplitude. After peak amplitude has been determined, the largest common constant operator, a divisor in this case, which fits within a consistent boundary, four bits for the example shown, is removed from the data. This defines the magnitude of a set of samples, sixty-four in number, that magnitude being noted as M1, M2 and M3 in FIGS. 2*b*, *c* and *d*. The remaining four bits of data after the division operation has been performed, is the sample data and is denominated as S1, S2, through S128 in FIGS. 2*b*, *c* and *d*. In storing the data in a compressed format, the magnitude data is only stored once for each set of sixty-four samples. The storage data is shown in FIG. 2*c*.

Upon decompression, the magnitude data is accessed from the memory and used as an operator or multiplier on its corresponding particular sixty-four sample set to obtain the decompressed data, diagrammatically illustrated in FIG. 2*d*. The sample data is sequentially accessed from memory, operated on, and converted to analog form to obtain the desired data on demand. With this technique, a large, approximate 2:1 compression ratio of data is obtained, while the audio quality of the original data is maintained.

Figure 3:
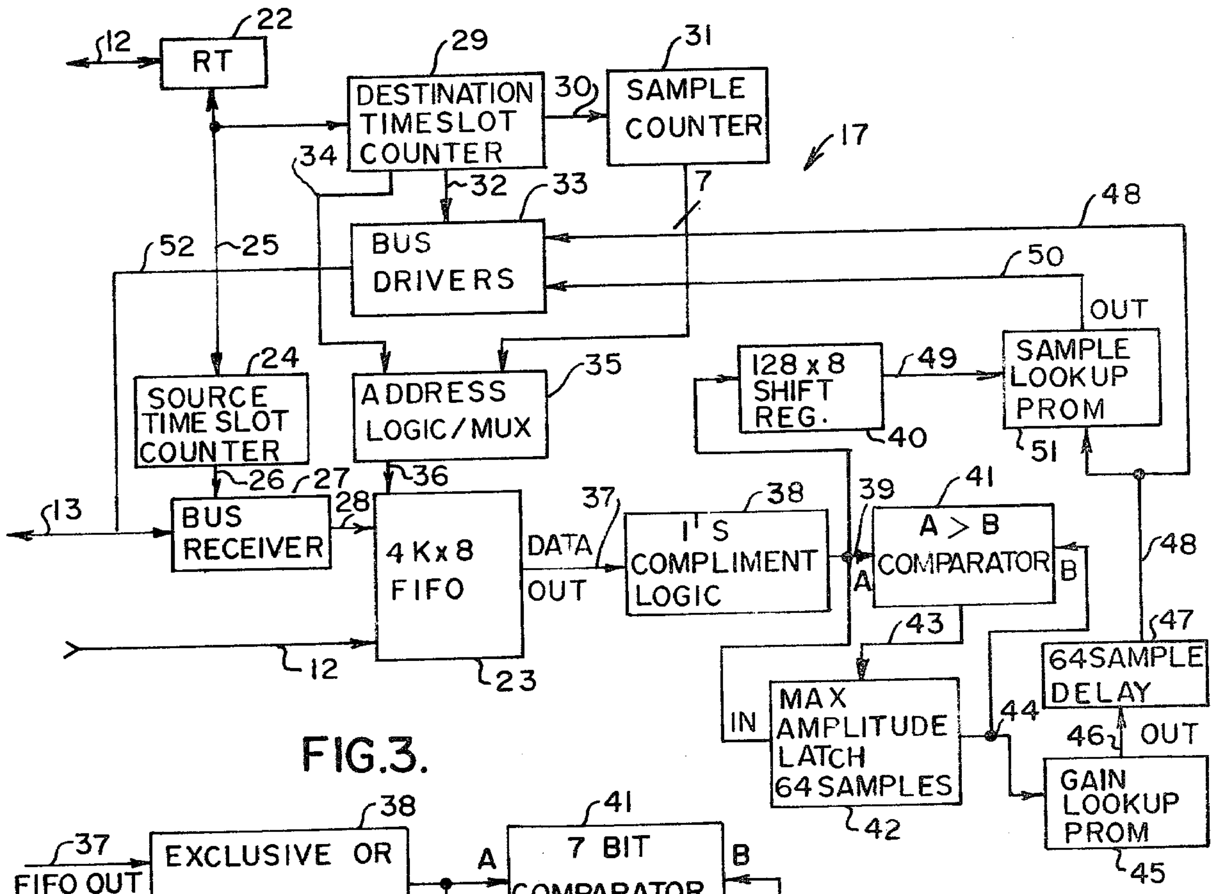
FIG. 3 is a block diagrammatic view of speech compression module shown in FIG. 1.

A more detailed block diagrammatic view of the speech compression module 17 is illustrated in FIG. 3. As there shown, the speech compression module 17, as part of the audio system 3, provides the capability to take digitized audio data from the bus 13, compress it, and play it back on the source bus 13 for real time loading of the speech memory means 20. As indicated, two common modes of operation for commercial embodiments are compressing and loading the speech memory directly from the telephone line interface 11 or from the back-up module 18. The invention is described in detail with respect to the first mentioned operational mode.

The bus 12 is connected to a receiver/transmitter 22, and to a first in, first out 4 K by eight buffer 23. The receiver/transmitter 22 is connected to a source time slot counter 24, along a condutor 25. The source time slot counter 24 has an output 26 connected to a bus receiver 27. Bus receiver 27 has an output 28 connected to the buffer 23. The conductor 25 also provides an input to a destination time slot counter 29. Counter 29 has an output 30 forming an input to a sample counter 31, an output 32 forming an input to bus line driver means 33, and an output 34 connected to address logic multiplexer means 35. Address logic multiplexer means 35 has an output 36 connected to the buffer 23.

Buffer 23 has an output 37 forming an input to logic means 38. Logic means 38 has an output 39 which forms an input to a shift register 40, a comparator 41 and a maximum amplitude latch 42. Comparator 41 also has an output 43 forming an input to the latch 42.

An output 44 of amplitude latch 42 forms an input to a gain lookup programmable read only memory (PROM) 45. Output 44 also is an input to the comparator 41. The PROM 45 has an output 46 forming an input to a delay means 47. An output 48 of delay means 47 is an input to a sample lookup programmable read only memory (PROM) 49. Output 48 also forms an input to the bus driver 33.

An output 49 from the shift register 40 is a second input to the PROM 51. An output 50 of the PROM 51 is a second input to the driver means 33. Driver means has an output 52 connected to the bus 13 in a conventional manner.

In general, input from the source bus 13 is sequentially loaded into the 4 K (1024) by eight first in, first out buffer 23. When the speech compression module 17 is activated, the present storage address of the buffer 23 is saved as a future output starting address. After the compression module 17 is activated by a suitable signal on the bus 12, the buffer 23 output is read out beginning at the stored starting address. If the buffer 23 output represents a negative data value, the data is complimented to an absolute or rectified magnitude in the logic means 38. This magnitude data is stored in the shift register 40 and at the same time is analyzed to find the largest magnitude occuring for each sixty-four sample in the comparator 41. The maximum amplitude determined in the comparator 41 is maintained in the max amplitude latch 42. After sixty-four samples have been examined the maximum amplitude is sent to the PROM 45. The PROM 45 contains the encoded maximum amplitude for the four bit gain factor representing the maximum signal level for the respective sixty-four sample period. An additional sixty-four sample delay 47 is included to give the gain factor the same delay as the magnitude samples which were stored in the shift register 40. The magnitude and gain factor for each sample is then applied to the lookup programmable read only memory 51 to obtain the proper encoded four bit data sample in compressed form. The gain factor on the output 48 and the encoded sample data on the output 50 is gated on the bus 13 through the drivers 33 during an appropriate time interval. Compression continues until the speech compression module 17 is deactivated. The operation of the PROM 45 and the PROM 51 may be considered a "division" step in that the PROM 45 determines a divisor gain factor based on the maximum amplitude of the input sample derived from comparator 41 latch 42 maximum amplitude operation and provides that divisor to the PROM 51. PROM 51 operation in turn removes the gain factor, i.e., "divides" the gain factor from the corresponding input sample. The PROM 45 and PROM 51 thus constitute means for removing the maximum amplitude from all samples of digital data.

Figure 4:
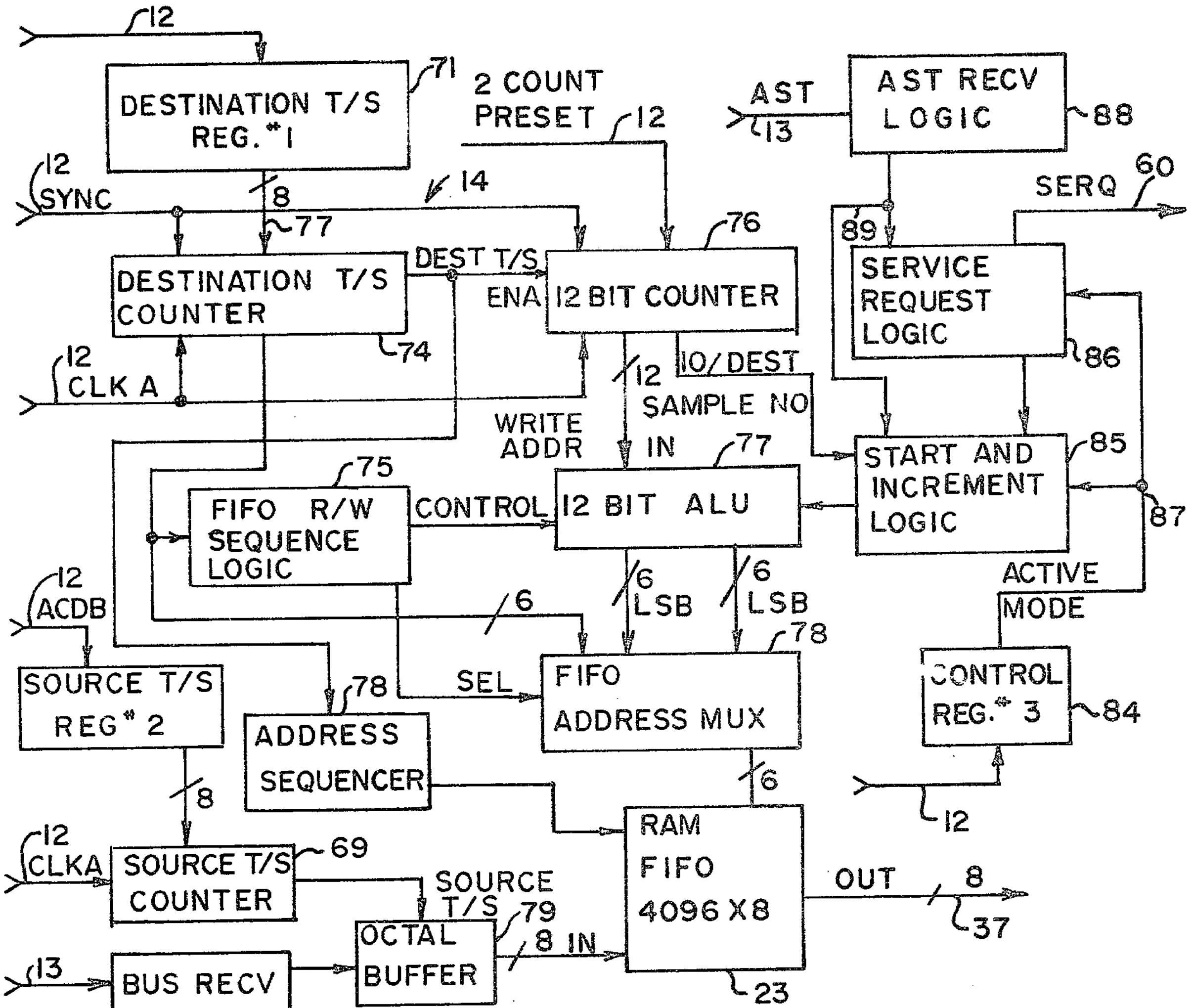
FIG. 4 is a more detailed block diagrammatic view of a first portion of the speech compression module shown in FIG. 3.
Figure 8:
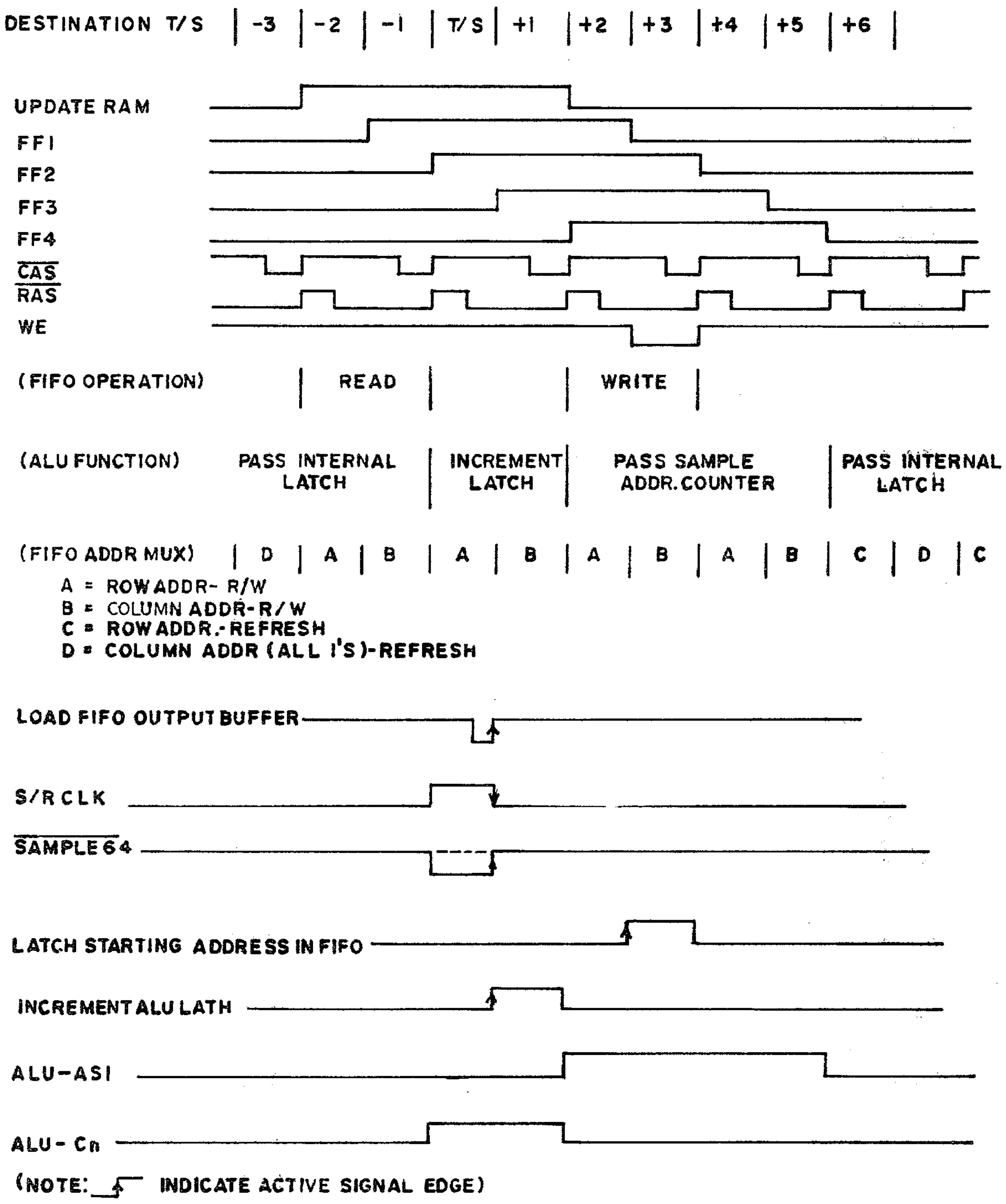
FIGS. 8 and 8*a* are timing charts illustrating the timing relationships employed in the speech compression module of FIG. 3.

FIG. 4 shows a detailed block diagrammatic view of the input buffer 23 and its associated control the sequencing logic. A register 71 of the source time slot counter 14 stores the input time slot number. An output 72 of the register 71 is used to preset a destination time slot counter 74. The all 1's count of the counter 74 is then decoded as the destination time slot. Most of the sequential timing associated with the storage and compression of data is synchronized to the destination time slot. The first in, first out rewrite sequence logic 75 and address sequencer circuitry blocks 78 provide for basic timing. These timing relationships are shown in FIG. 8. The destination time slot counter 71 is also further counted down by a twelve bit binary counter 76. The first ten stages of the counter 76 are used as the sample number counter which is preset to a count of two at the beginning of a segment by an input signal over bus 12. The counter is preset by two counts due to the speech memory update function which requires a two sample lead on update data, as later described. Therefore, compressed data begins and ends two sample times prior to the beginning of a new speech segment. These ten bits and the remaining two bits are also used to provide the sequencing addressing for the buffer 23 by way of an arithmetic logic unit (ALU) 77. The twelve bit ALU provides three functions in controlling the buffer 23 addressing. It is used to store the beginning address in its internal latch, it increments this latch for use at a buffer 23 read address sequencer 78 and it multiplexes at its output either the ALU 77 input or the latch address data. The FIFO address multiplexer 78 converts the twelve bit output from the ALU 77 to two sequential six bit row and column addresses as required by the random access memories (RAM's) of the buffer 23. Also, during the idle time between the RAM update cycles a sequential row address is selected by the multiplexer which provides the refresh cycles required by the RAM's of the buffer 23. Timing for the read/write operations on the buffer 23 is shown in FIG. 8. Input data for the buffer 23 originates at the audio data bus 13 at a receiver 70 and is strobed into a holding buffer 79 on signal from a counter means 69 during the source time slot. The buffer 23 is of sufficient size, in the embodiment illustrated, to store up to four-one hundred twenty eight milliseconds segments of eight K hertz sample input data.

When the speech compressor 17 is activated, the present sample counter state is latched in the arithmetic logic unit 77 either immediately or following the receipt of an audio start pulse on the audio bus 13, depending on the state of the mode bit. A control register means 84 is connected to a start and increment logic means 85 and to a service request means 86 along a conductor 87. Audio start receiver means 88 is connected to the service request means 86 and to the start and increment means 85 along a conductor 89. The audio start pulse is checked in the means 85 to ensure that it occurs during the source time slot. The buffer 23 continues to store input data for each following source time slot.

Figure 8A:
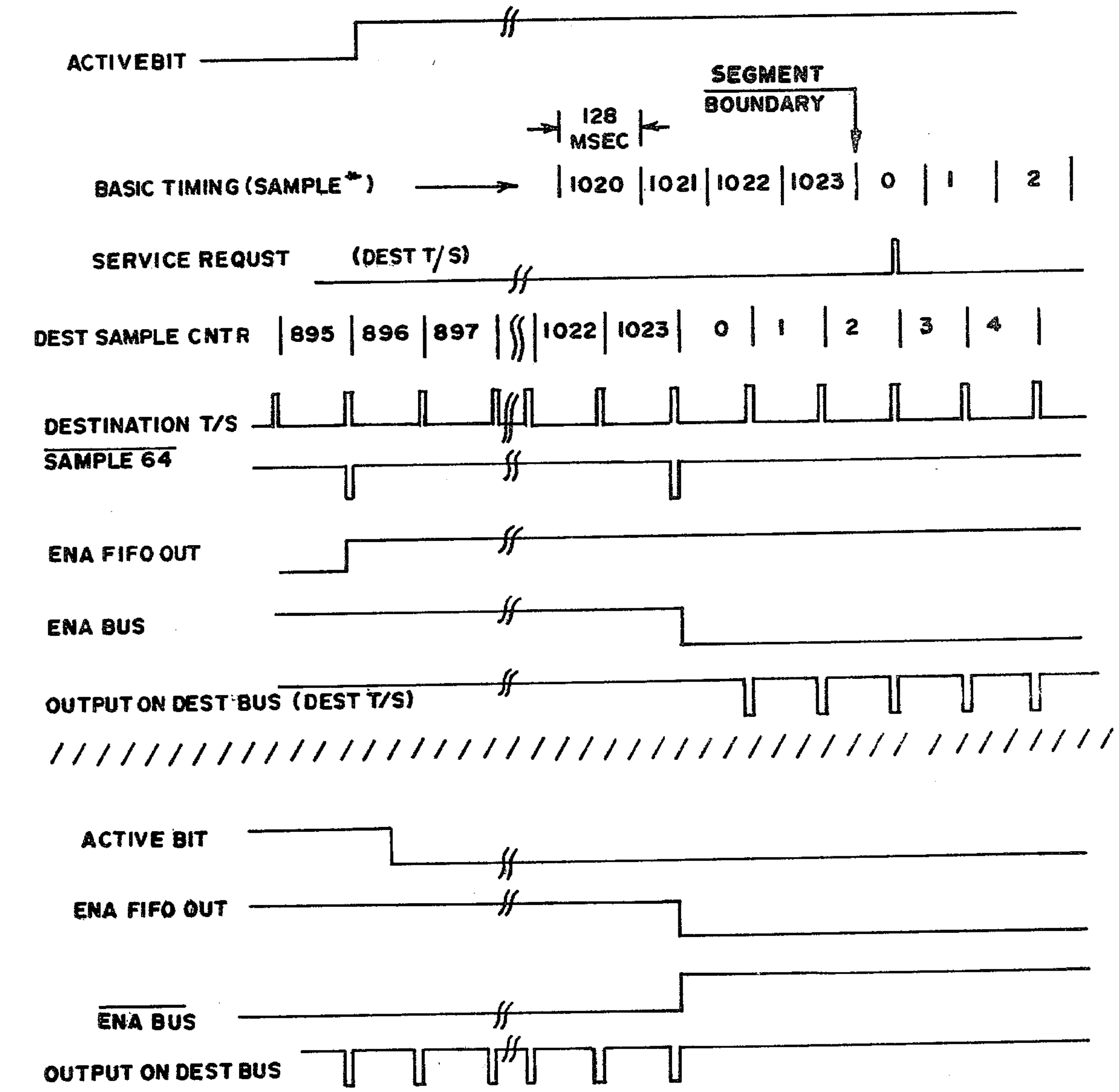

Following the next segment boundary, compressor 17 generates a service request along an output 60 during the destination time slot. Timing and the signals associated with their reading of buffer 23 output data are shown in FIG. 8*a*. During the read time of the following eight hundred ninety-fifth sample period (sixty-four sample periods prior to the segment boundary), the enable buffer 23 out signal is generated which enables the compression circuitry and also begins the incrementing of the read address counter in the arithmetic logic unit 77 following each read/write cycle. When the all 1's count of the twelve bit counter 76 is reached, the compressed output data is gated on the audio bus 13 during the designated time slot. This data gate is enabled for the sample time of 1022 to give the required two sample lead on the basic segment timing and likewise after the speech compressor 17 is deactivated, the compression continues until the end of sample 1021 time. Therefore, compressed output data is synchronized to the segment boundaries.

Figure 5:
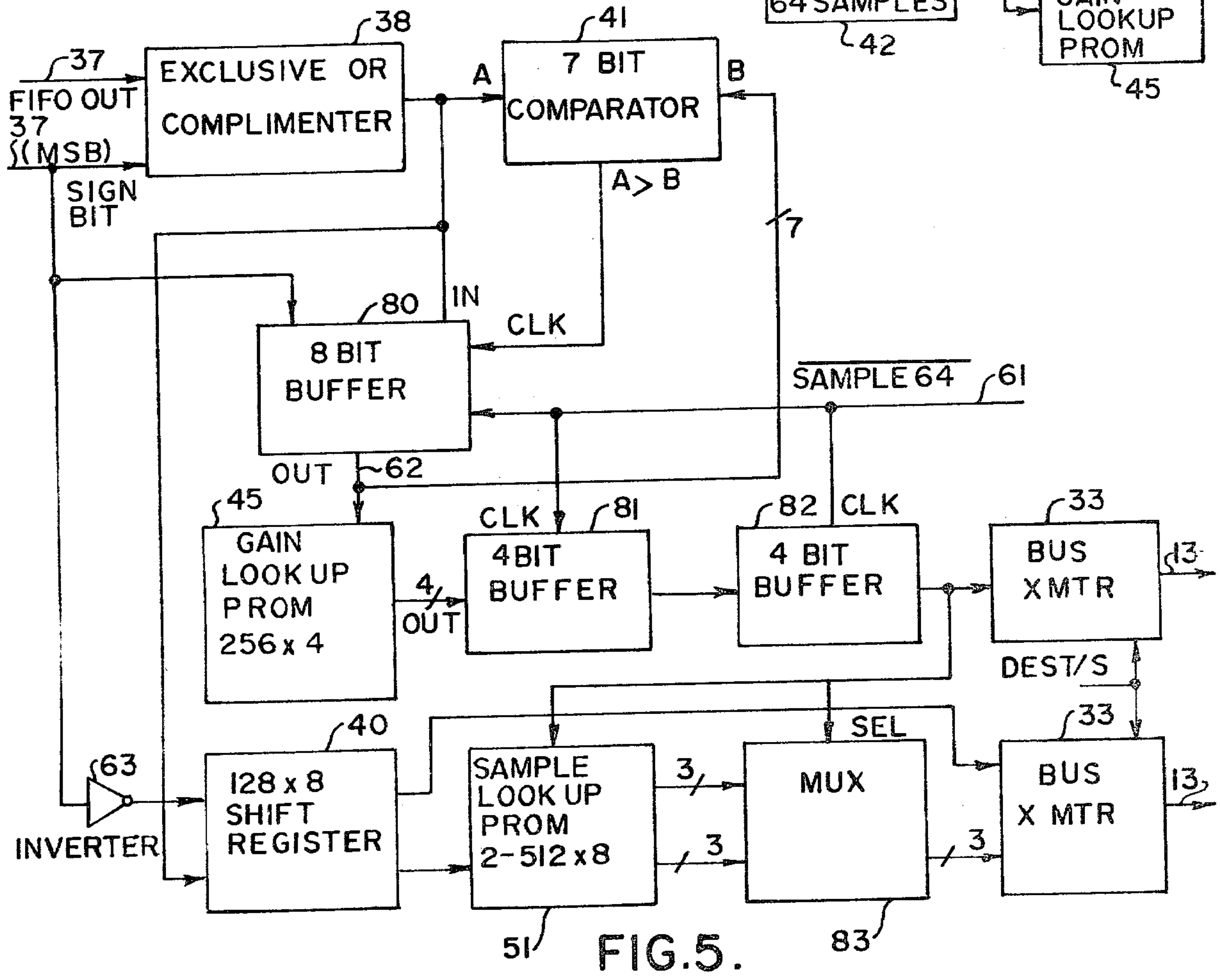
FIG. 5 is a more detailed block diagrammatic view of a second portion of the speech compression module shown in FIG. 3.

Data from the buffer 23 passes along output 37 to the complimentary logic means 38, best seen in FIG. 5, which inverts the seven least significant bits of data if the most significant bit is a 1, indicating a negative value. The circuitry thus provides an absolute magnitude conversion on the input data. This magnitude data is then analyzed for the maximum value for each sixty-four samples. The comparator 41 and a buffer 80 determine the maximum amplitude for each sixty-four sample interval. The circuit performs this by comparing each input magnitude to the largest previously stored in the buffer 80, and if the new value is larger, it then stores that level for the next comparison. At the beginning of each sixty-four sample period, the buffer is loaded with the initial input magnitude along an input 61. An output 62 of the magnitude buffer supplies the address to the gain lookup PROM 45. This maximum magnitude is then encoded by the lookup PROM as a four bit gain factor and is stored in a four bit buffer 81 at the end of the sixty-four sample period. At the end of the next sixty-four sample period, the gain factor is shifted to a gain output buffer 82. The most significant bit output of the logic means 38 forms an input, via an inverter 63 to a one hundred twenty-eight bit long by eight bit shift register 40 which stores the input signal magnitude during the time that the gain factor is being determined. The stored gain factor and the associated input sample data from the shift register output are encoded by the lookup PROM 51. The outputs of the PROM 51 are wired ORed, and the most significant gain factor bit is used to select the proper output. The second most significant gain bit is used to control a multiplexer 83 which selects the upper or lower PROM 51 output. The three bits from this multiplexer along with the inverted sign bit for each stored sample magnitude then forms the four bit compressed sample. The compressed data which consists of four bits of gain factor and four bits of sample data are then gated onto the source bus 13 from the bus drivers 33.

Figure 6:
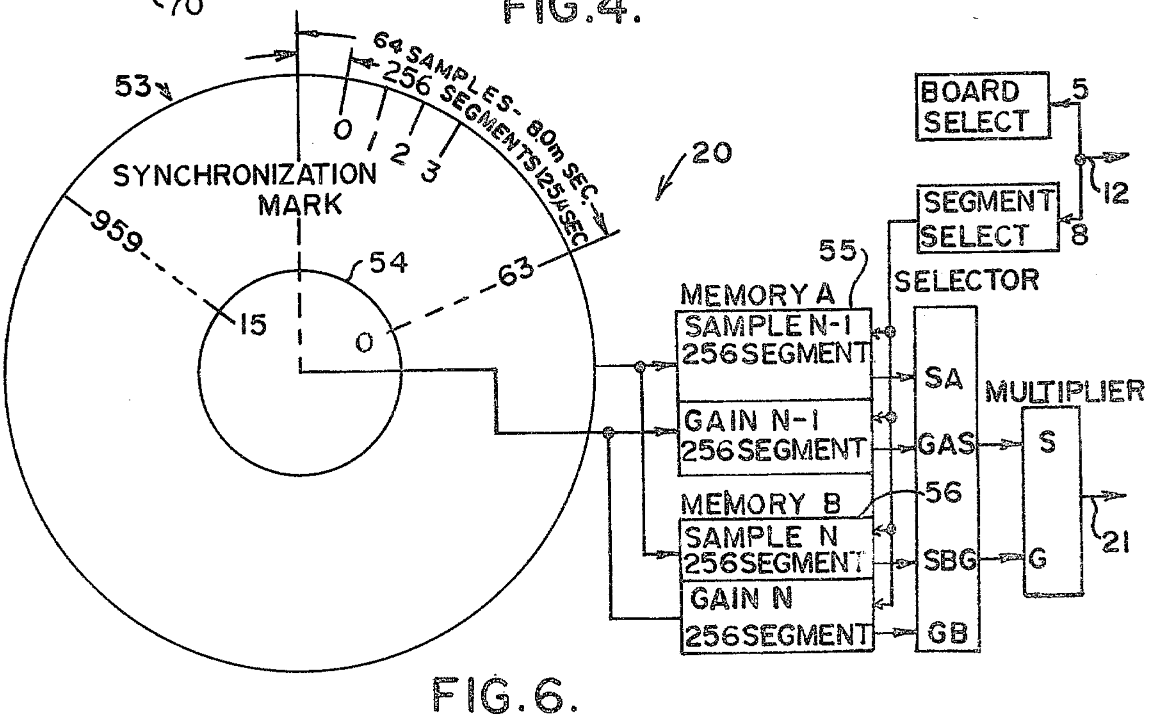
FIG. 6 is a block diagrammatic view of a memory means employed in the system of FIG. 1.

The speech memory 20 receives input data from the speech compression module 17 along the bus 13. The memory 20 comprises a plurality of charge coupled device (CCD) memories grouped so as to take thirty-two seconds of audio memory per memory board 53. Each board 53 is multiported to enable two hundred fifty-six simultaneous accesses to any part of the memory. As seen in FIG. 6, each board 53 is divided into two hundred fifty-six segments, each segment containing one thousand twenty-four samples of data. As indicated above, magnitude data is constant over sixty-four samples of data, and therefore, only a single magnitude data sample must be stored for each sixty-four samples. The magnitude data is stored in a smaller storage means indicated by the reference numeral 54 in FIG. 6.

Multi access to the audio data is possible through the use of two output buffers 55 and 56, respectively. All audio data is defined in groups of one thousand twenty-four samples (one hundred twenty-eight millisecnds) and the playing out of this data is limited to starting on one hundred twenty-eight millisecnds boundaries. The memory 20 can be thought of as a rotating memory or a recirculating shift register. Sample zero on all two hundred fifty-six segments is stored in the first two hundred fifty-six memory nibble (4 bits) locations. Sample 1 of all two hundred fifty-six segments is stored in the next two hundred fifty-six memory nibble locatons, and so forth, so that sample number 1023 of all two hundred fifty-six segments is stored in the last two hundred fifty-six locations. Magnitude data is stored in the smaller memory 54, which need be only one sixty-fourth the size of the sample memory 20. The memory 54 is interleaved in the same manner as the sample data. The two buffers 55 and 56 are used as sample buffers where sample N of all segments is stored in one of the buffers and sample N-1 of all segments is stored in the other. While one buffer is being loaded, the other is available for access. The access time is divided into two hundred fifty-six time slots such that up to two hundred fifty-six accesses can be made on the Nth sample stored in the buffer. Since the Nth sample of all segments is in the buffer, any of the two hundred fifty-six accesses can access any one of the Nth samples of the two hundred fifty-six segments of audio stored in the board. This enables up to two hundred fifty-six messages to be played simultaneously. Any combination, from all messages being the same to all messages being different is possible.

Figure 9:
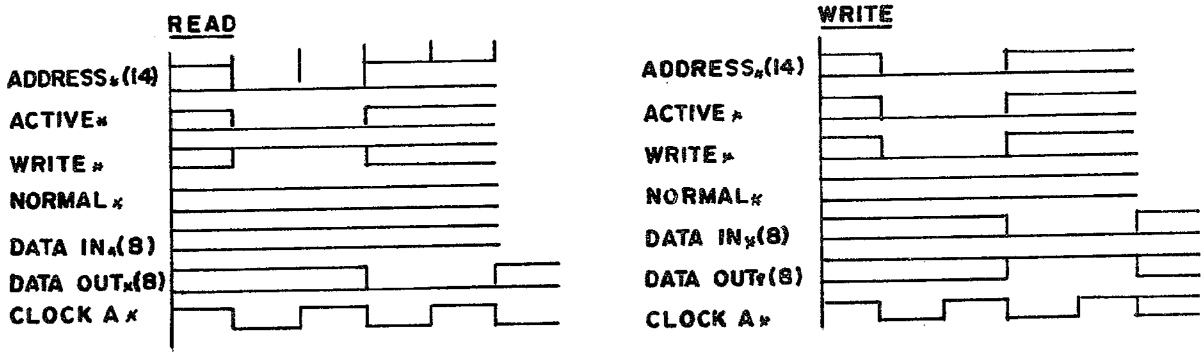
FIG. 9 is a timing chart illustrating the timing relationships employed in the memory means of FIG. 6.

The interface signals and timing for the memory boards 53 are shown in FIG. 9. In the particular embodiment of this invention, there are fourteen address lines, three control lines (write, active and norm), eight data-in lines, and eight data-out lines. Interface signals are on the fixed time basis of time slots described above. Two hundred fifty-six time slots are available every one hundred twenty-five microseconds. That is to say, they are all available at eight K hertz intervals. Each slot is approximately four hundred eighty-eight nonoseconds wide. The address and control signals are present to the memory boards 53 one time slot ahead of the data. In the data output mode, this enables a full time slot to access the data and also allows the data to be latched and output for a full time slot.

Figure 7:
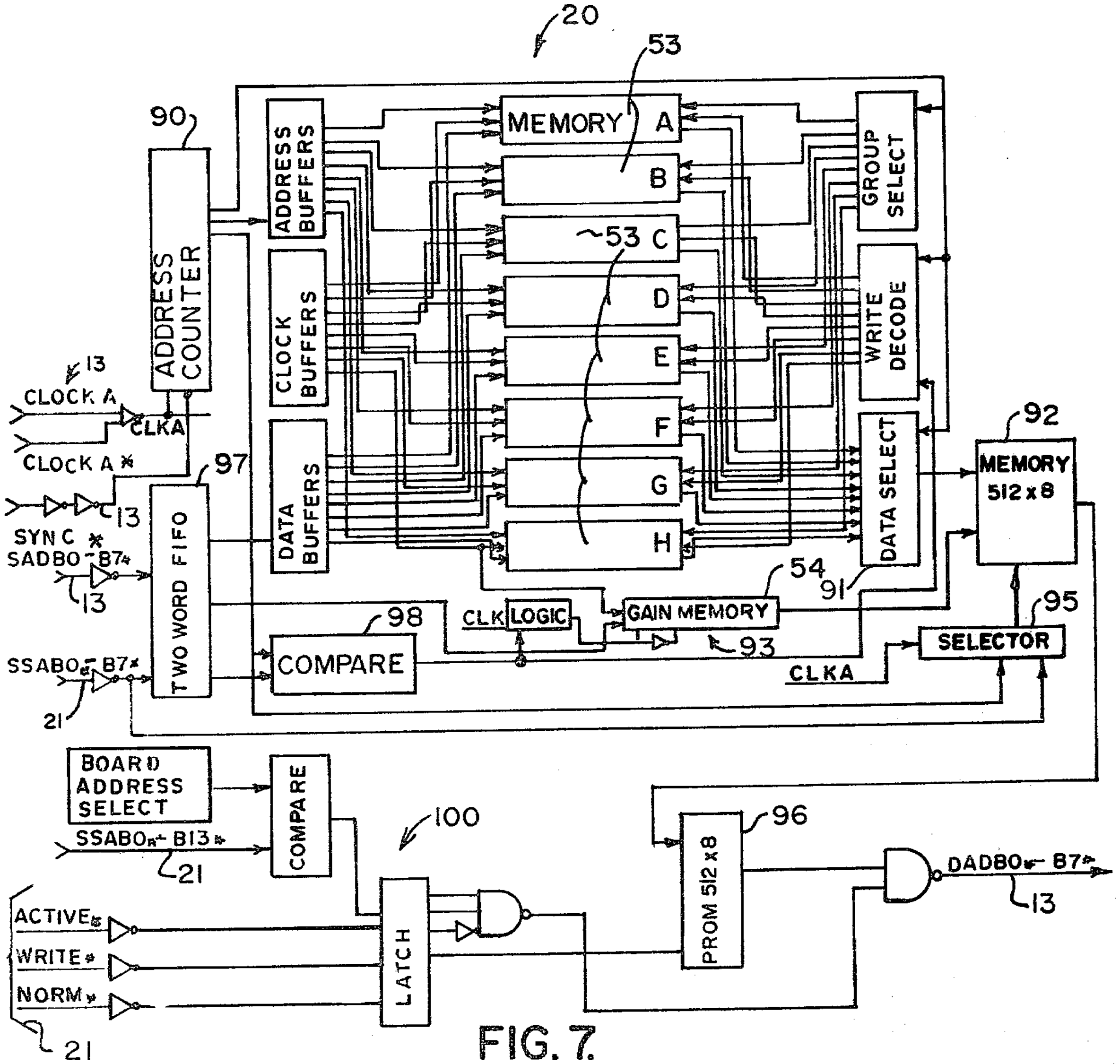
FIG. 7 is a more detailed block diagrammatic view of the memory means shown in FIG. 6.

Referring to FIG. 7, fourteen address lines are labeled SSABO* through SSAB13*, the * always signifying the not function. The data in lines are labeled SADBO* through SADB7*. The data-out lines are called DADBO* through DADB7*. The control lines are called Active Write* and Norm*. SSAB8* through SSAB13* are used as a board select and SSAB0* through SSAB7* are used as a segment select.

Two signals, CLCKA and SYNC are used to keep the memory boards 53 in time with the rest of the system. CLCKA occurs one cycle for each time slot and SYNC occurs every one thousand twenty-four sample time frames and is one time slot wide. An address counter string 90 keeps track of the current time slot and sample number. Sixty-four charge coupled devices are used for storing all of the sample data. Each charge coupled device stores 4 K samples, which is equivalent to one-half second of audio. The CCD's are arranged in groups of eight so as to reduce the loading on the clocks, addresses and input data drivers. Data selection means 91 includes a plurality of selectors used to select one of the eight groups of eight CCD outputs. This selected output is then latched into memory means 92, whose output then appears like the output of a recirculating shift register.

Gain memory means 93 is used to store gain data. This data recirculates in a slightly different manner than the sample data so as to enable the gain data and the sample data to align properly. Gain data also is latched in the memory means 92 along with the sample data. Memory means 92 includes eight 1K memories which are used to buffer the Nth and N−1 samples of all segments. Half of the memories are not used, the other half is divided into two two hundred fifty-six byte storage buffers. While one buffer is being filled with the Nth sample of all two hundred fifty-six segments, the other is available for reading any of the Nth−1 samples of all segments. Each buffer then alternates from a read buffer to a write buffer as the sample counts increment. The first half of each time slot is used for writing into a buffer and the second half of each time slot is available for reading the other buffer. Control is maintained by selector means 95. When a read is being made, the data is latched at the end of the address time slot in the memory means 92. Output of the memory means 92 drives a programmable read only memory (PROM) 96. PROM 96 feeds into the output data driver of the system. When the control for the read is NORM*, the output of the PROM is multiplied by the gain data times the sample data.

Writing in the memory boards 53 must be synchronized two sample periods ahead of the read from memory. Remembering that one sample period consists of two hundred fifty-six time slots on the audio bus 13 and identically to two hundred fifty-six segments in the memory shift register, it is apparent that to be able to write into sample N of any of the segments, the data must be available some time during sample N−1. Since sample N is written into the buffer during sample N time, it is not available for reading until sample N+1 time. Hence, the two sample time shifts between write and read. Only one time slot can be writing into memory at any given time. However, writing may occur from any time slot. This limits input data to memory to one every 125 usec. thus eliminating the requirement for excessively large input first in, first out buffer 97. A two stage FIFO buffer 97 is all that is required to enable writing into any segment from any time slot.

An eight bit comparator means 98 compares the present memory segment number with the segment address of the data to be written. When the two compare, a write command is given and the sample is stored. If the gain storage memory means 93 has circulated to the proper register and data slot, it too will be written into. One gain data segment is written for every sixty-four sample segments. Due to the asynchronous nature of the gain memory means 93, relative to the sample memory 20, the gain will be written from somewhere between the sixteenth and forty-eighth sample data. This requires that the gain data, although used only once, be sent with every one of the sixty-four sample data segments.

An output control means 100 for generating gate output commands in from the PROM 96 is conventional and is not described in detail.

It thus may be observed that a system has been provided which meets all the ends and objects herein set forth above.

Numerous variations, within the scope of the appended claims, will be apparent to those skilled in the art in light of the preceding description and drawings. Thus, the specification enumerates a number of conductors and buses for electrically connecting various assemblies of the invention. Those skilled in the art will recognize that the diagrammatic illustration of single conductors merely facilitates the verbal description of the circuit under consideration and that the single conductors shown may be conductor pluralities in commercial embodiments of this invention. The information disclosed in the drawings and described above should enable competent practioners to construct physical circuits from the block diagrams shown. If additional circuit design information is desired, it may be obtained, for example in *Fairchild Semiconductor MOS/CCD Data Book* (1975), available from Fairchild Semiconductor, 464 Ellis St., Mountain View, California 94042 and *The TTL Data Book for Design Engineers*, Second Edition (1976), available from Texas Instruments, Inc., P.O. Box 5021, Mail Station 808, Dallas, Texas 75222. Although a particular sample rate and size, and various timing decisions based on those considerations were described as preferred, other rates or sample size are compatible with the broader aspects of the invention. These variations are merely illustrative.

Having thus described the invention, what is claimed and desired to be secured by Letters Patent is:

1. A system for real time audio data compression and expansion, comprising:

means for digitizing input audio data;

means for sampling the digitized audio data;

means for determining the maximum amplitude of the audio data over some predetermined time period;

a first programmable read-only memory means having an input side operatively connected to said maximum amplitude determining means for encoding the maximum amplitude to obtain a gain factor at an output side;

a second programmable read-only memory means having a first input operatively connected to the output side of said first programmable read-only memory means and a second input for receiving the digitized audio data corresponding to the predetermined time period for which the gain factor is determined, said second programmable read-only memory means utilizing the gain factor at its first input in conjunction with the digitized audio data at its second input to obtain a scaled value of the audio data so as to provide a reconstituted compressed sample data at its output side thereby obtaining an approximate two-to-one reduction in the bit size of the compressed sample data as compared to the bit size of the digitized audio data;

means for transmitting the reconstituted compressed sample data from the output side of the second programmable read-only memory means and the gain factor from the output side of the first programmable read-only memory means to a storage medium;

means for storing all of the reconstituted compressed data from the output side of said second programmable read-only memory means but only one occurrence of the corresponding gain factor applied at the first input of said second programmable read-only memory means for the compressed data for said predetermined time period on the storage medium.

2. The system of claim 1 further including:

means for calling up data from said storage means; and means for combining the gain factor with the called up data.

3. The system of claim 2 wherein said storage means comprises a plurality of charge coupled devices for storing a predetermined segment of audio data in digital form; and a pair of buffers operatively connected to said charge coupled devices, said gain combining means comprising means for multiplying the output of said buffers by the gain factor of said audio data.

4. The system of claim 3 wherein said means for determining the maximum amplitude of the audio data over some predetermined period includes means for determining the absolute value of the amplitude of said data, means for comparing the amplitude of a first sample with the amplitude of a second sample later in time, and means for storing the greater value of the amplitude for said first and said second sample.

* * * * *